(12) United States Patent
Klein et al.

(10) Patent No.: US 9,540,226 B2
(45) Date of Patent: Jan. 10, 2017

(54) SYSTEM AND METHOD FOR A MEMS TRANSDUCER

(71) Applicant: Infineon Technologies AG, Neubiberg (DE)

(72) Inventors: Wolfgang Klein, Zorneding (DE); Martin Wurzer, Munich (DE); Stefan Barzen, Munich (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/717,556

(22) Filed: May 20, 2015

(65) Prior Publication Data

US 2016/0340173 A1    Nov. 24, 2016

(51) Int. Cl.
*H01L 29/84* (2006.01)
*B81B 3/00* (2006.01)
*B81C 1/00* (2006.01)

(52) U.S. Cl.
CPC ........... *B81B 3/007* (2013.01); *B81C 1/00658* (2013.01); *B81B 2203/0127* (2013.01); *B81B 2203/0307* (2013.01); *B81B 2203/0315* (2013.01); *B81B 2203/0353* (2013.01)

(58) Field of Classification Search
USPC .......... 257/416, 418, 254, E21.002, E29.324,257/419; 310/323.02, 334, 313 R, 367; 252/62.9 PZ; 359/824, 199.1; 428/50, 53, 428/51, 52
See application file for complete search history.

(56) References Cited

U.S. PATENT DOCUMENTS

| | | |
|---|---|---|
| 8,237,521 B1 | 8/2012 | Smith |
| 8,362,853 B2 | 1/2013 | Park |
| 8,461,655 B2 | 6/2013 | Klein |
| 8,975,107 B2 | 3/2015 | Dehe et al. |
| 2012/0027235 A1 | 2/2012 | Chan et al. |
| 2012/0148071 A1* | 6/2012 | Dehe ..................... H04R 1/005 381/116 |
| 2013/0177180 A1 | 7/2013 | Bharatan et al. |
| 2013/0221453 A1* | 8/2013 | Dehe ..................... H04R 19/005 257/415 |

* cited by examiner

*Primary Examiner* — Tram H Nguyen
(74) *Attorney, Agent, or Firm* — Slater Matsil, LLP

(57) ABSTRACT

According to an embodiment, a microelectromechanical systems (MEMS) transducer includes a first electrode, a second electrode fixed to an anchor at a perimeter of the second electrode, and a mechanical support separate from the anchor at the perimeter of the second electrode and mechanically connected to the first electrode and the second electrode. The mechanical support is fixed to a portion of the second electrode such that, during operation, a maximum deflection of the second electrode occurs between the mechanical structure and the perimeter of the second electrode.

36 Claims, 13 Drawing Sheets

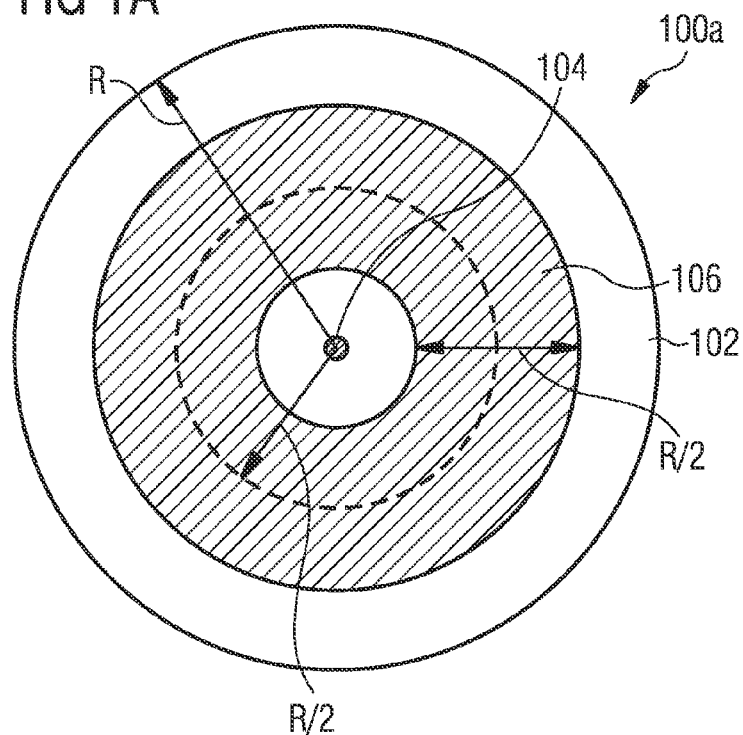
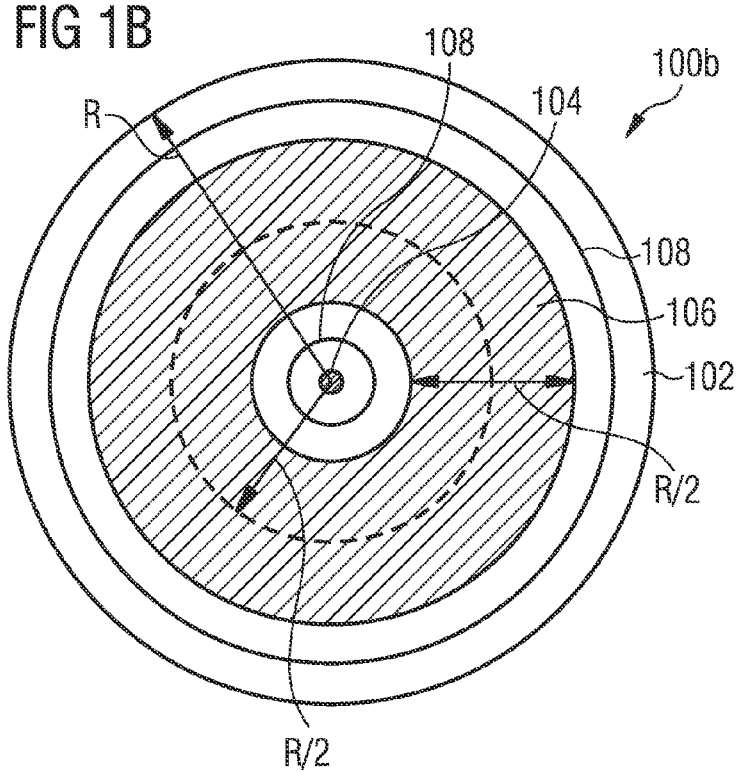

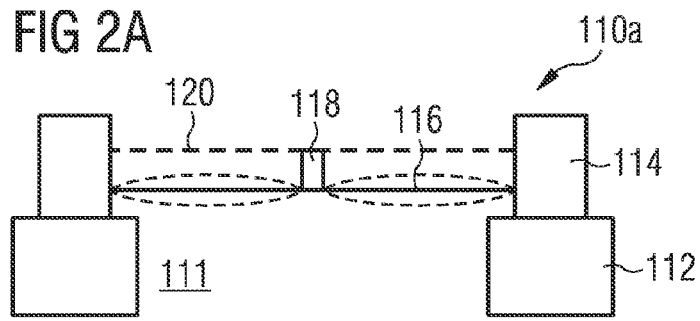
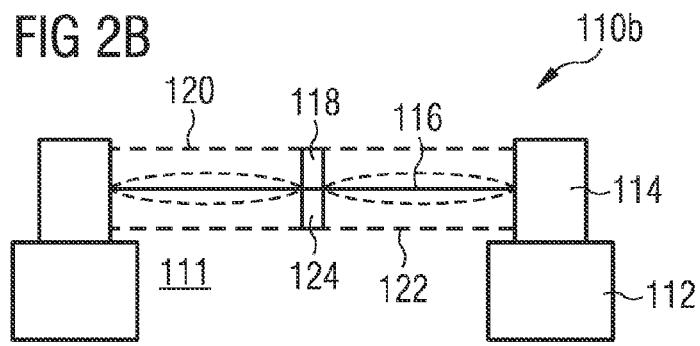
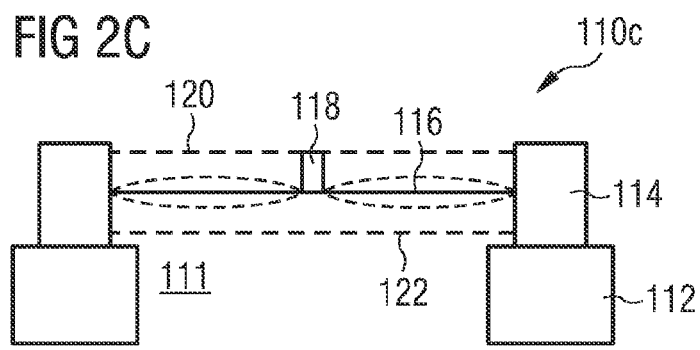
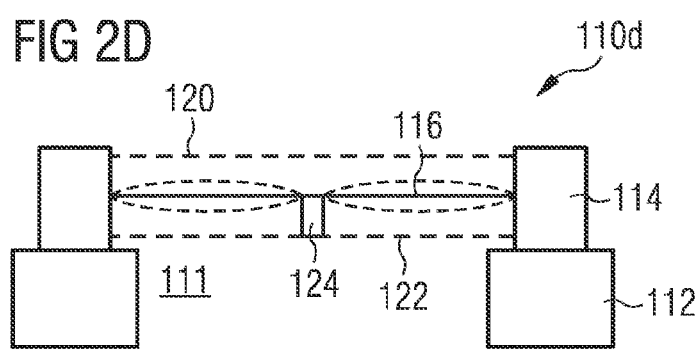

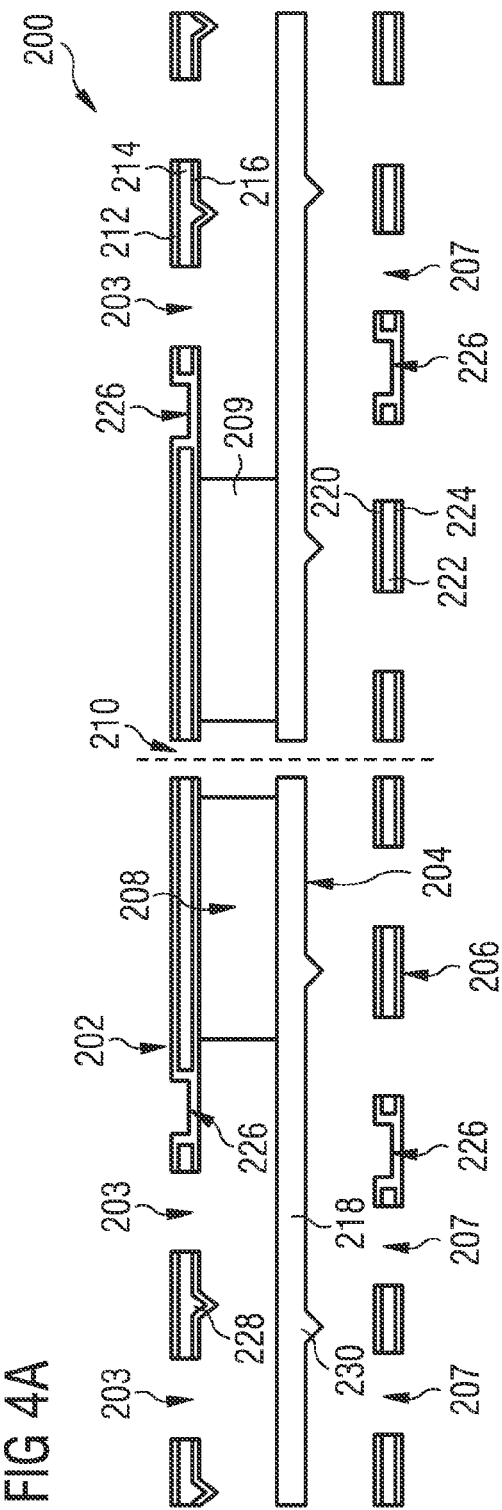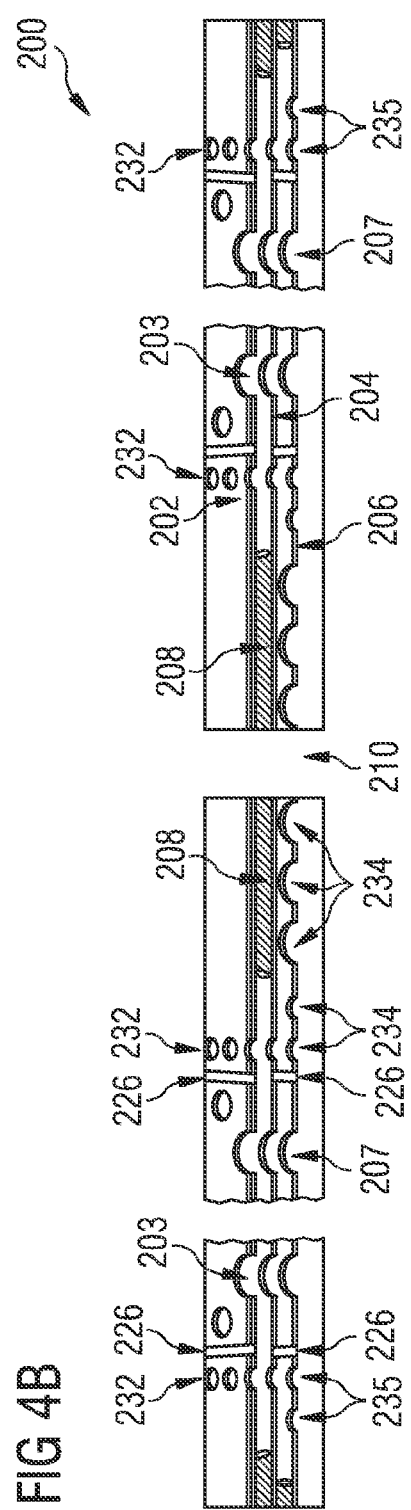

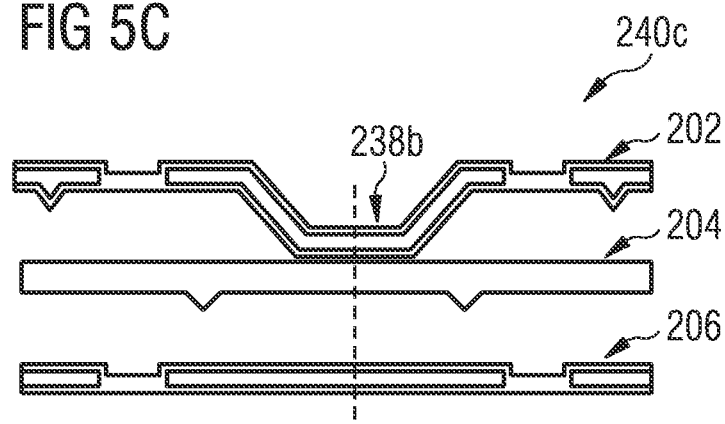
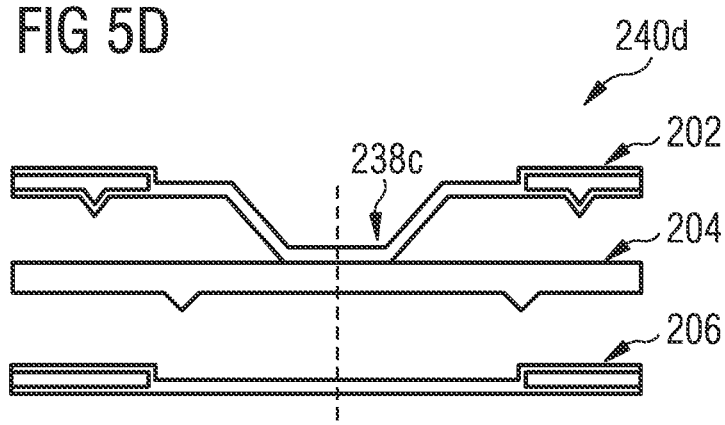
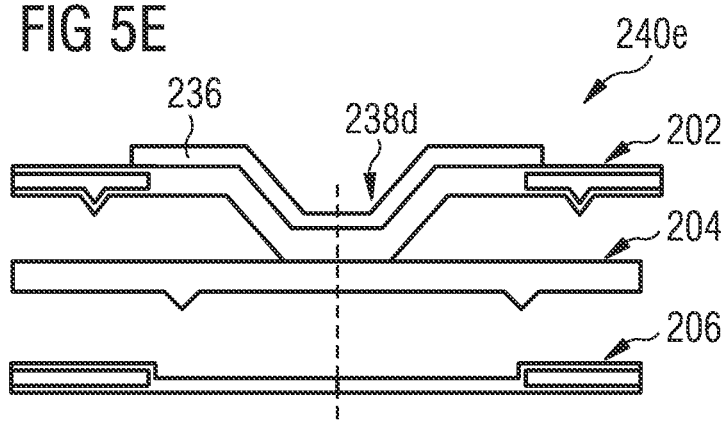

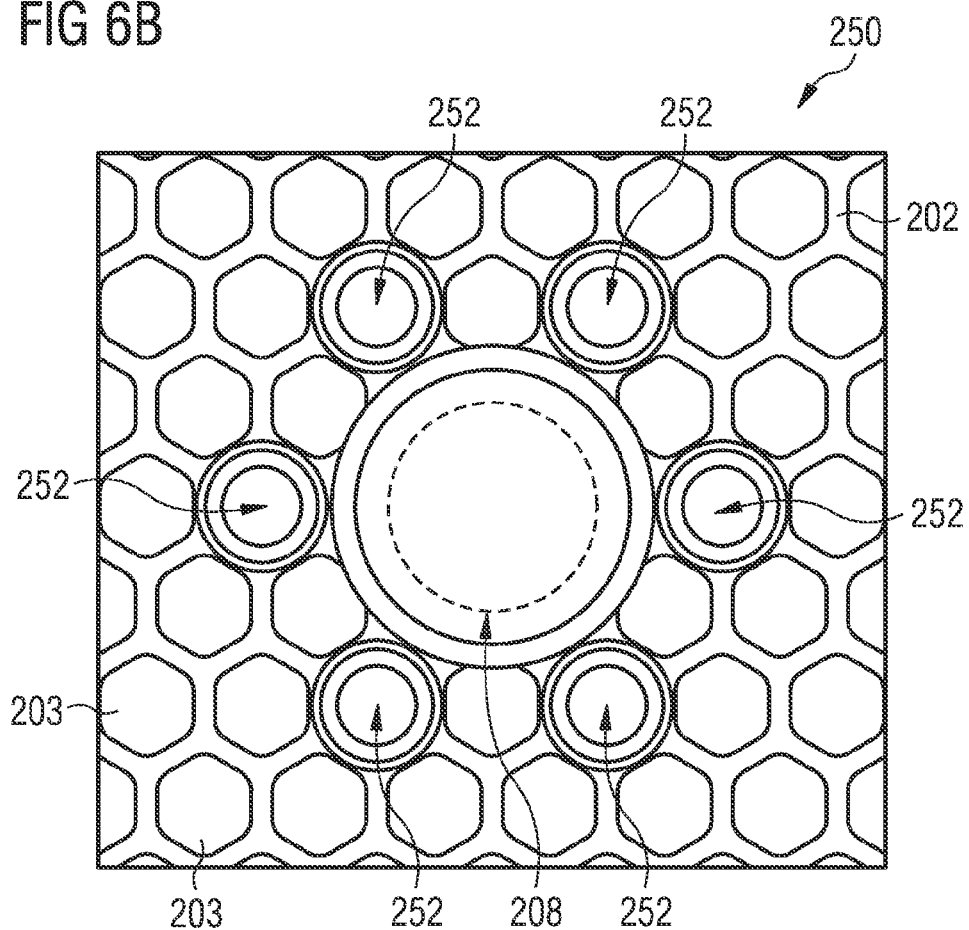

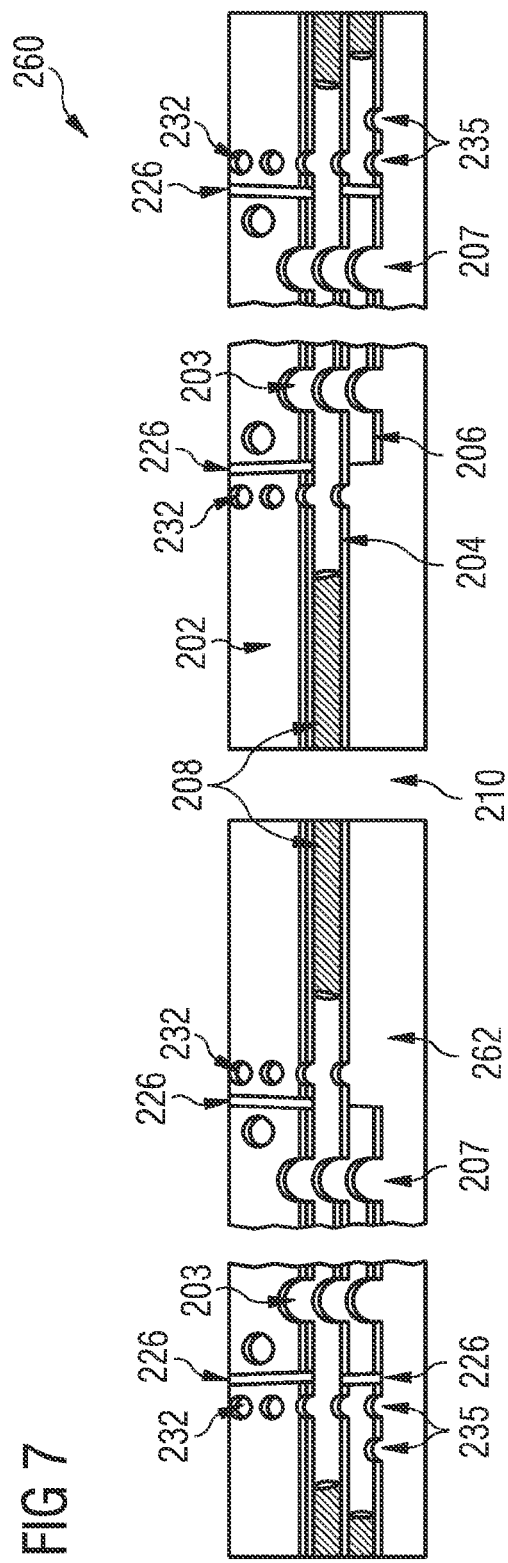

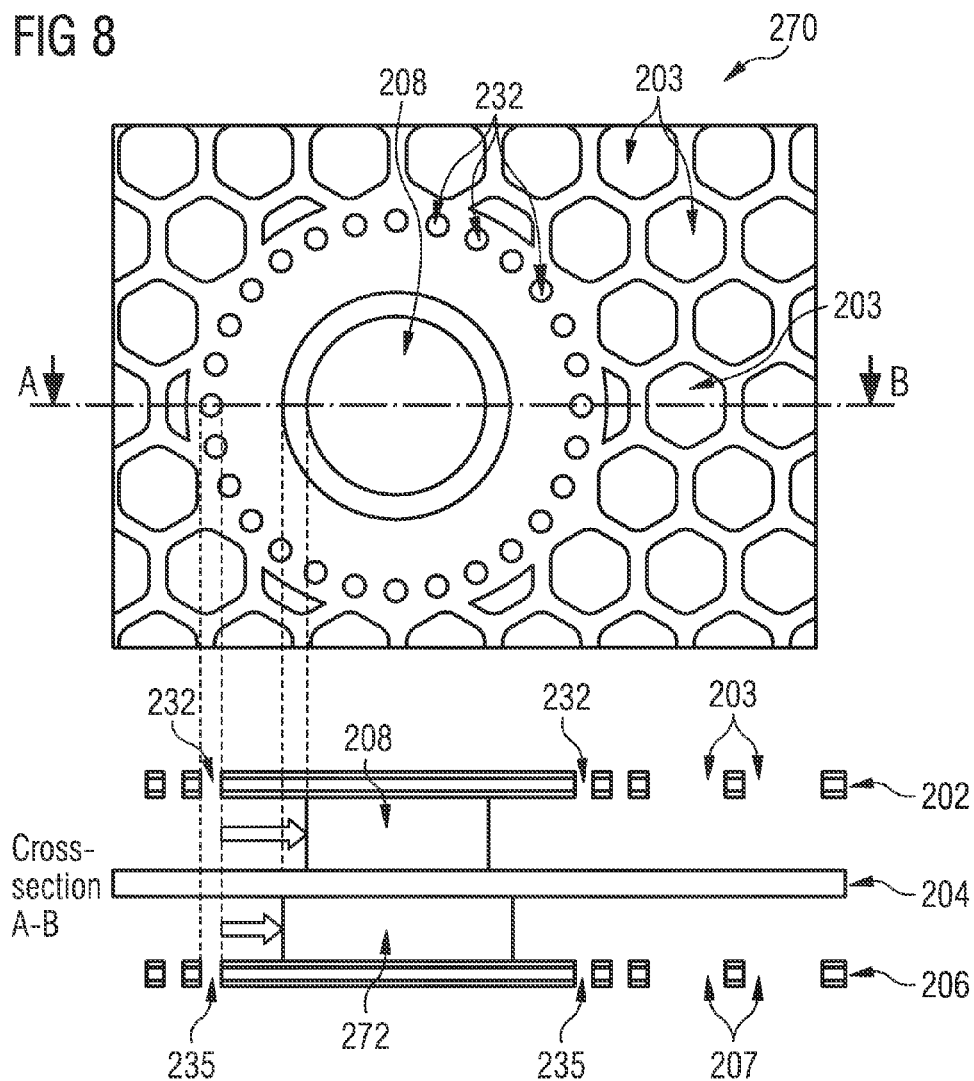

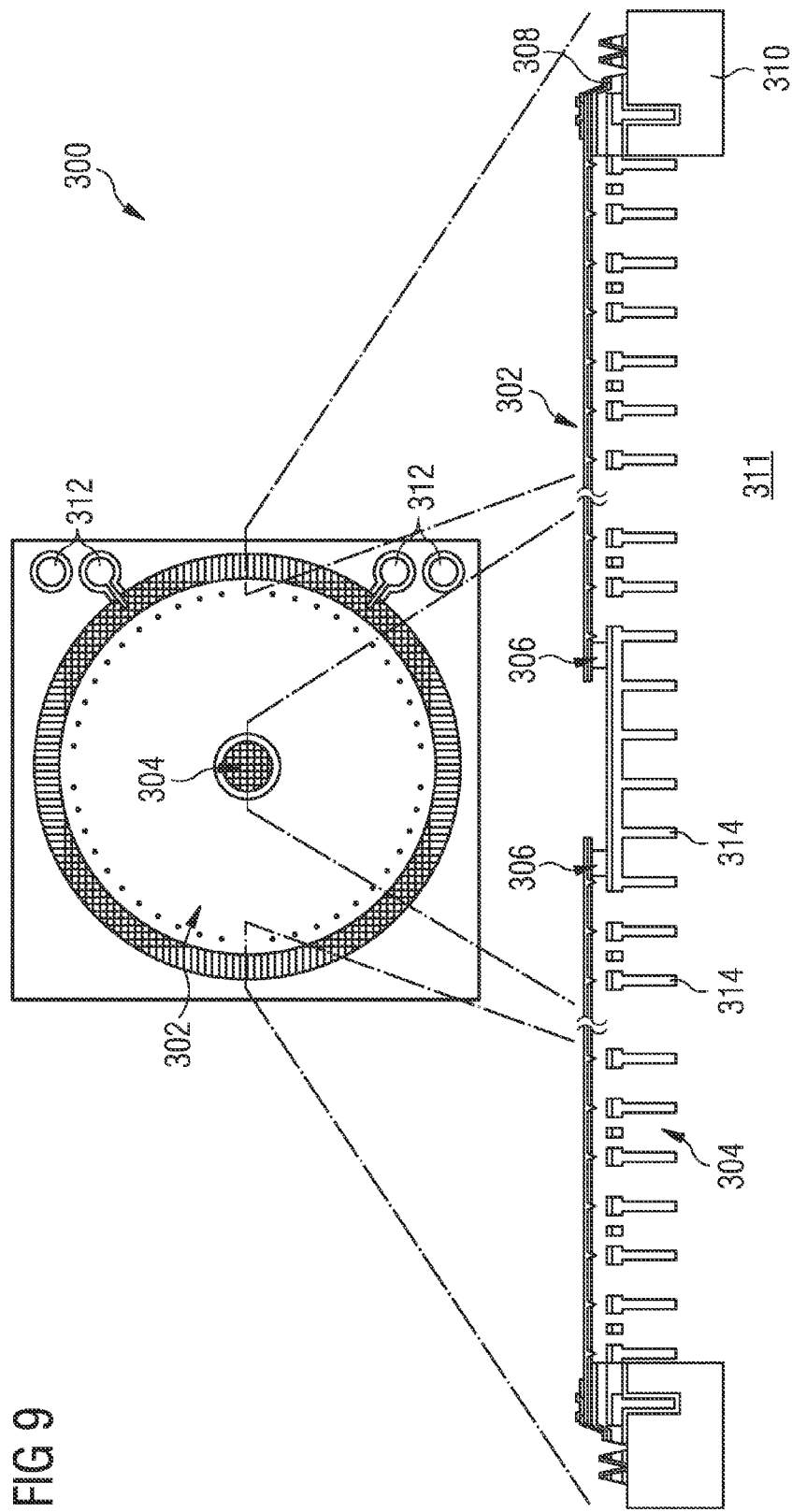

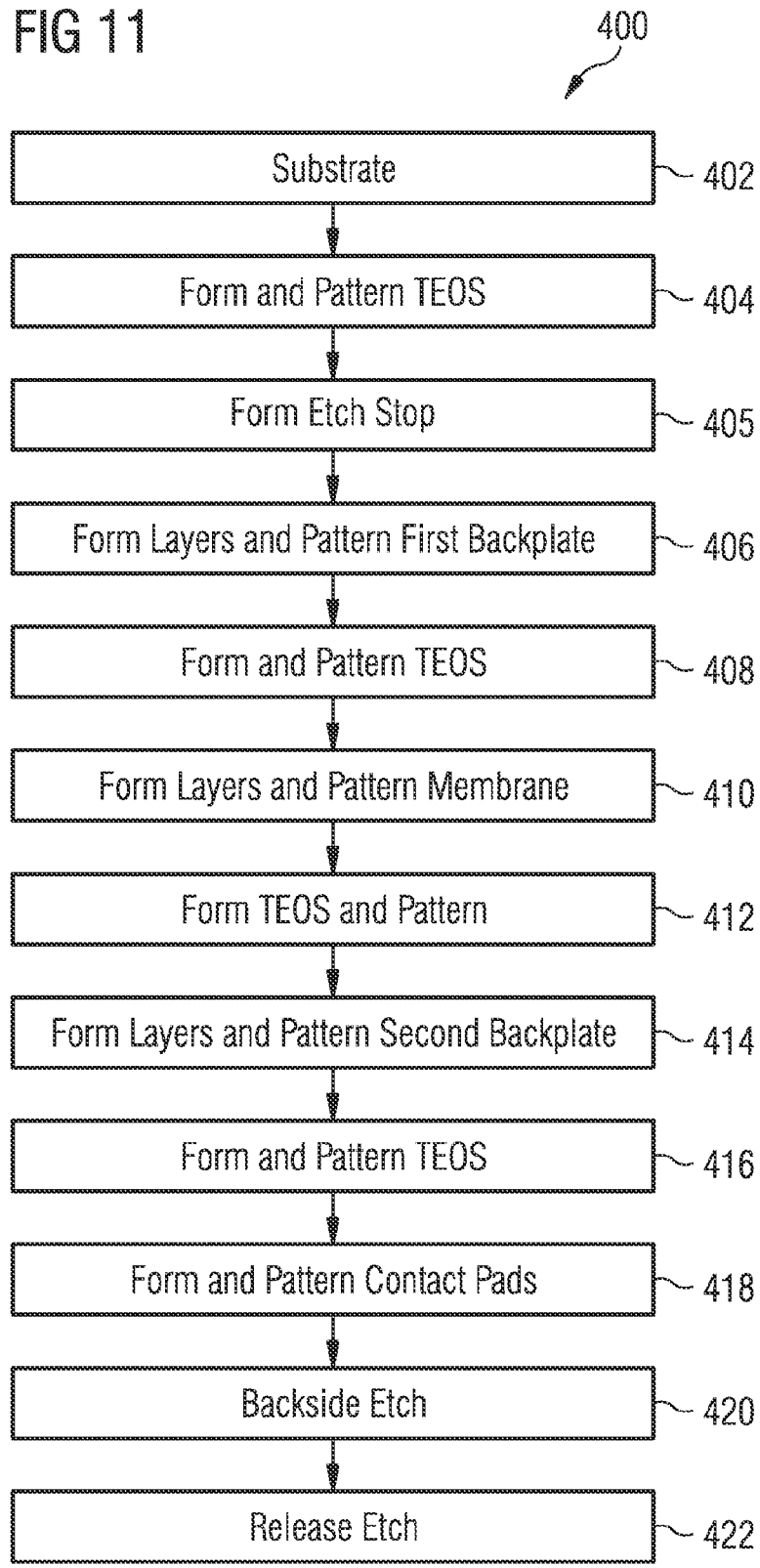

SYSTEM AND METHOD FOR A MEMS TRANSDUCER

TECHNICAL FIELD

The present invention relates generally to microelectromechanical systems (MEMS) transducers, and, in particular embodiments, to a system and method for a MEMS Center Post Acoustic Transducer.

BACKGROUND

Transducers convert signals from one domain to another. For example, some sensors are transducers that convert physical signals into electrical signals. On the other hand, some transducers convert electrical signals into physical signals. A common type of sensor is a pressure sensor that converts pressure differences and/or pressure changes into electrical signals. Pressure sensors have numerous applications including, for example, atmospheric pressure sensing, altitude sensing, and weather monitoring. Another common type of sensor is a microphone that converts acoustic signals into electrical signals.

Microelectromechanical systems (MEMS) based transducers include a family of transducers produced using micromachining techniques. MEMS, such as a MEMS pressure sensor or MEMS microphone, gather information from the environment by measuring the change of physical state in the transducer and transferring the signal to electronics in order to be processed by the electronics, which are connected to the MEMS sensor. MEMS devices may be manufactured using micromachining fabrication techniques similar to those used for integrated circuits.

MEMS devices may be designed to function as oscillators, resonators, accelerometers, gyroscopes, pressure sensors, microphones, microspeakers, and/or micro-mirrors, for example. Many MEMS devices use capacitive sensing techniques for transducing the physical phenomenon into electrical signals. In such applications, the capacitance change in the sensor is converted to a voltage signal using interface circuits.

Microphones and microspeakers may also be implemented as capacitive MEMS devices that include deflectable membranes and rigid backplates. For a microphone, an acoustic signal as a pressure difference causes the membrane to deflect. Generally, the deflection of the membrane causes a change in distance between the membrane and the backplate, thereby changing the capacitance. Thus, the microphone measures the acoustic signal and generates an electrical signal. For a microspeaker, an electrical signal is applied between the backplate and the membrane at a certain frequency. The electrical signal causes the membrane to oscillate at the frequency of the applied electrical signal, which changes the distance between the backplate and the membrane. As the membrane oscillates, the deflections of the membrane cause local pressure changes in the surrounding medium and produce acoustic signals, i.e., sound waves.

In MEMS microphones or microspeakers, as well as in other MEMS devices that include deflectable structures for sensing or actuation, pull-in or collapse is a common issue. If a voltage is applied to the backplate and the membrane, there is a risk of sticking as the membrane and the backplate move closer together during deflection. This sticking of the two plates is often referred to as pull-in or collapse and may cause device failure in some cases.

SUMMARY

According to an embodiment, a microelectromechanical systems (MEMS) transducer includes a first electrode, a second electrode fixed to an anchor at a perimeter of the second electrode, and a mechanical support separate from the anchor at the perimeter of the second electrode and mechanically connected to the first electrode and the second electrode. The mechanical support is fixed to a portion of the second electrode such that, during operation, a maximum deflection of the second electrode occurs between the mechanical structure and the perimeter of the second electrode.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b illustrate top view schematic diagrams of embodiment MEMS acoustic transducers;

FIGS. 2a, 2b, 2c, and 2d illustrate side view schematic diagrams of embodiment MEMS acoustic transducers;

FIGS. 4a, 4b, and 4c illustrate schematic diagrams of portions of an embodiment transducer structure;

FIGS. 5a, 5b, 5c, 5d, and 5e illustrate cross-sectional views of portions of further embodiment transducer structures;

FIGS. 6a and 6b illustrate schematic diagrams of portions of another embodiment transducer structure;

FIG. 7 illustrates a schematic diagram of portions of still another embodiment transducer structure;

FIG. 8 illustrates a schematic diagram top view with a cross-sectional view of a portion of a yet further embodiment transducer structure;

FIG. 9 illustrates a schematic diagram top view with cross-sectional views of a still further embodiment transducer structure;

FIG. 11 illustrates a block diagram of a method of forming an embodiment MEMS acoustic transducer.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3A:
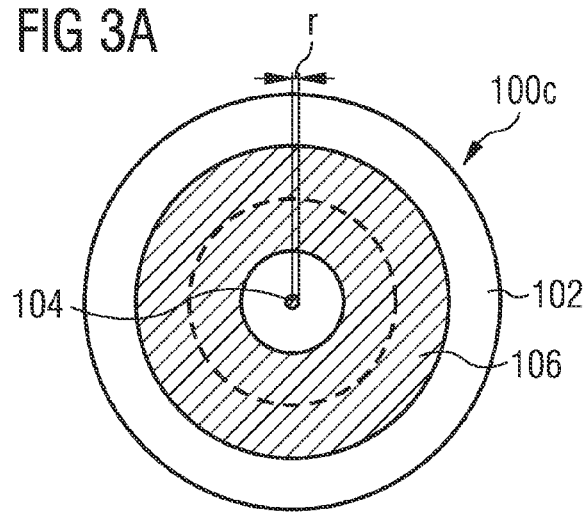
FIGS. 3a, 3b, and 3c illustrate top view schematic diagrams of additional embodiment MEMS acoustic transducers.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely MEMS transducers, and more particularly, MEMS acoustic transducers. Some of the various embodiments described herein include MEMS capacitive acoustic transducers, MEMS microphones, mechanical support MEMS microphones, and fabrication sequences for MEMS transducers. In other embodiments, aspects may also be applied to other applications involving any type of transducer according to any fashion as known in the art.

In conventional capacitive plate microphones, maximum deflection of the sensing membrane generally occurs near the center of the membrane. According to various embodiments described herein, a MEMS acoustic transducer includes a mechanical structure connected between a perforated backplate and a deflectable membrane in any region of the backplate and the membrane. In particular embodiments, the MEMS acoustic transducer includes the mechanical structure connected between the perforated backplate and the deflectable membrane in a center of the backplate and the membrane. In such embodiments, the mechanical structure may be referred to as a center post. The center post or mechanical structure fixes the membrane such that maximum deflection of the membrane occurs, during operation, between the center post and a perimeter of the membrane where the membrane is fixed to a support structure. When the post or mechanical structure is not arranged in the center of the membrane, the maximum deflection is shifted from a center point of the membrane to some place between the attachment of the mechanical structure and the perimeter of the membrane where the membrane is fixed to a support structure.

In such embodiments, the first harmonic of the membrane is altered, preventing maximum deflection at the center of the membrane, and maximum deflection occurs according to the second harmonic of the membrane without a center post. Thus, the new first harmonic of a membrane with a mechanical structure, such as a center post, is similar to the second harmonic of the membrane without a center post. When a membrane deflects, the deflection of the membrane decreases from the maximum deflection point at the center to a fixed edge on the perimeter of the membrane. Generally, about half of the radius taken from the maximum deflection point at the center of the membrane is identified as the active area of the membrane, while the other half of the radius, including the smaller deflection near the perimeter of the membrane, is identified outside the active area. Active area is a determining factor in capacitance and sensitivity for capacitive plate MEMS acoustic transducers. According to various embodiments, the position of the mechanical structure or center post shifts the active area to a band or donut-shape (referred to hereinafter as an annulus) active area that is larger in area than an active area identified as half the radius of an equally sized membrane without the center post. Thus, in various embodiments, the active area may be increased for a same size of membrane.

In still further embodiments, the center post prevents collapse of the membrane and allows reduced stiffness or a higher bias voltage to be applied with less risk of membrane collapse or pull-in. In such embodiments, the sensitivity of the MEMS acoustic transducer may be further improved.

According to various embodiments described herein, a MEMS acoustic transducer may be a MEMS microphone or a MEMS microspeaker. Although description included herein primarily refers to a center post, the mechanical structure attached to the membrane may have any shape and be attached to other portions of the membrane in further embodiments. In specific embodiments, the mechanical structure may be a ring with a hollow central region or a column with a rectangular cross-section. The mechanical structure and the shape of the membrane may be varied in different embodiments. In specific embodiments, the membrane may have a square shape and the mechanical structure may be located away from the center and include one or more structures attaching to the membrane at one or more points.

FIGS. 1a and 1b illustrate top view schematic diagrams of embodiment MEMS acoustic transducers 100a and 100b. FIG. 1a illustrates MEMS acoustic transducer 100a including membrane 102, center post 104, and active area 106. According to various embodiments, center post 104 fixes, e.g., anchors, the center of membrane 102 in order to prevent deflection at the center of membrane 102. Membrane 102 has a radius R and is fixed or clamped to a structural layer around a perimeter of membrane 102 (not shown, described herein below in reference to the other figures). Further, MEMS acoustic transducer 100a includes a backplate (not shown). Together, the backplate and membrane 102 form capacitive sensing plates of the variable capacitance MEMS acoustic transducer.

As described hereinabove, about half of radius R, i.e., R/2, of membrane 102 would be active area if center post 104 were omitted. In various embodiments, center post 104 causes a maximum deflection of membrane 102 to occur near R/2 (indicated by the dotted line). In particular embodiments, the maximum deflection of membrane 102 is shifted from R/2 towards center post 104. In various embodiments, active area 106 includes the annulus with a band having a width of about R/2 extending partially on either side of radius R/2 from center post 104, i.e., extending from about R/4 to about 3·R/4. Thus, active area 106 is larger than a corresponding active area of half radius R taken from the center point if center post 104 were omitted. In such embodiments, the active area of membrane 102 may be increased without increasing the overall dimensions of membrane 102. In various embodiments, center post 104 may be other types of mechanical connections or structures with various shapes attached to membrane 102 in the center or elsewhere.

FIG. 1b illustrates MEMS acoustic transducer 100b including membrane 102, center post 104, active area 106, and segmentation 108. According to various embodiments, MEMS acoustic transducer 100b is as described hereinabove in reference to MEMS acoustic transducer 100a in FIG. 1a, with the addition of segmentation 108 in membrane 102. As described hereinabove, membrane 102 is formed of a conductive material that forms a plate of the variable capacitance formed with the backplate (not shown). Segmentation 108 in membrane 102 separates portions of the conductive material in membrane 102 in order to reduce the parasitic capacitance of membrane 102. Segmentation may also be included in the backplate (not shown). Segmentation 108 may be included as described in co-pending U.S. patent application Ser. No. 14/275,337, filed May 12, 2014 and entitled "MEMS Device," which is included herein by reference in its entirety.

FIGS. 2a, 2b, 2c, and 2d illustrate side view schematic diagrams of embodiment MEMS acoustic transducers 110a, 110b, 110c, and 110d. According to various embodiments, MEMS acoustic transducers 110a, 110b, 110c, and 110d may have a circular membrane and backplate shape when viewed from above such as described hereinabove in reference to membrane 102 in FIGS. 1a and 1b.

FIG. 2a illustrates MEMS acoustic transducer 110a including substrate 112, structural support 114, membrane 116, center post 118, and backplate 120. According to various embodiments, backplate 120 is a rigid perforated backplate spaced apart from membrane 116 and membrane 116 is a deflectable membrane. As described hereinabove in reference to center post 104 in FIGS. 1a and 1b, center post 118 fixes, or anchors, the center of membrane 116. Center post 118 is also fixed, or anchored, to backplate 120. Because center post 118 is fixed between backplate 120, which is rigid, and membrane 116, the maximum deflection of membrane 116 occurs at a point between center post 118 and the perimeter of membrane 116 at structural support 114. Both membrane 116 and backplate 120 are attached, e.g., fixed, anchored, or clamped, to structural support 114 around the perimeter of membrane 116 and backplate 120, respectively. Together, backplate 120 and membrane 116 form top and bottom plates of the variable capacitance parallel plate capacitor that forms the acoustic transducer and provides transduction of acoustic signals based on the deflections of membrane 116.

According to various embodiments, membrane 116 is formed over cavity 111, which is a cavity formed in substrate 112, and backplate 120 is formed over membrane 116. In other embodiments, backplate 120 may be formed over cavity 111 and membrane 116 may be formed over backplate 120. In some embodiments, cavity 111 may be coupled to a sound port in a device housing, for example. In other embodiments, cavity 111 defines or is part of a back volume and the region above MEMS acoustic transducer 110a is coupled to a sound port in the device housing. In various embodiments, center post 118 may be other types of mechanical connections or structures with various shapes arranged between backplate 120 and membrane 116 in the center or elsewhere.

FIG. 2b illustrates MEMS acoustic transducer 110b including substrate 112, structural support 114, membrane 116, center post 118, backplate 120, backplate 122, and center post 124. According to various embodiments, MEMS acoustic transducer 110b is a dual-backplate acoustic transducer, such as a dual-backplate microphone or microspeaker. Backplate 120 and backplate 122 form two sensing plates for sensing deflections of membrane 116. Center post 118 and center post 124 fix the center of membrane 116 to backplate 120 and backplate 122, respectively. In various embodiments, center post 124 may be other types of mechanical connections or structures with various shapes arranged between backplate 122 and membrane 116 in the center or elsewhere.

FIG. 2c illustrates MEMS acoustic transducer 110c including substrate 112, structural support 114, membrane 116, center post 118, backplate 120, and backplate 122. According to various embodiments, MEMS acoustic transducer 110c is similar to MEMS acoustic transducer 110b without center post 124. Thus, center post 118 fixes membrane 116 to backplate 120, and backplate 122 is not fixed to membrane 116.

FIG. 2d illustrates MEMS acoustic transducer 110d including substrate 112, structural support 114, membrane 116, backplate 120, backplate 122, and center post 124. According to various embodiments, MEMS acoustic transducer 110d is similar to MEMS acoustic transducer 110b without center post 118. Thus, center post 124 fixes membrane 116 to backplate 122, and backplate 120 is not fixed to membrane 116.

In various embodiments, center post 118, center post 124, and structural support 114 may be formed of insulating material, such as oxide for example. In some embodiments, center post 118 or center post 124 is formed of a same material as structural support 114.

Figure 3B:
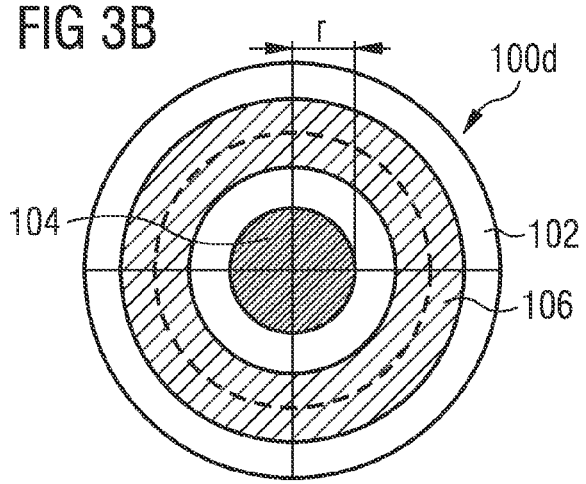
Figure 3C:
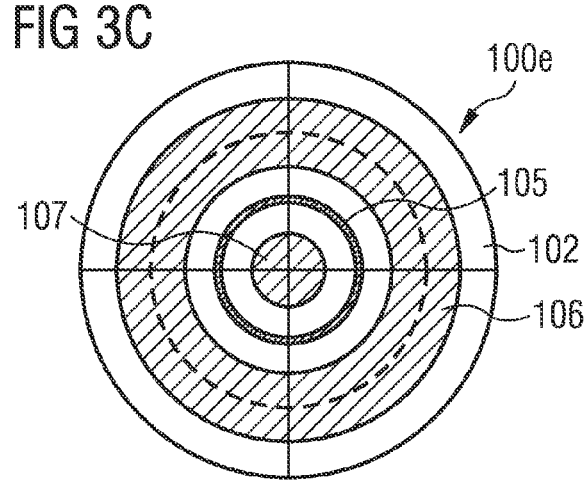

FIGS. 3a, 3b, and 3c illustrate top view schematic diagrams of additional embodiment MEMS acoustic transducers 100c, 100d, and 100e. According to various embodiments, MEMS acoustic transducers 100c, 100d, and 100e illustrate additional embodiments for center post configurations and may include backplates, structural support, and a substrate (not shown) as described hereinabove in reference to FIGS. 2a, 2b, 2c, and 2d.

FIG. 3a illustrates MEMS acoustic transducer 100c including membrane 102, center post 104, and active area 106 as similarly described hereinabove in reference to FIG. 1a. According to various embodiments, center post 104 has post radius r. Post radius r may be small. For example, post radius may be less than 50 µm. When post radius r is small, the mechanical stability of membrane 102 is decreased and active area 106 is increased.

FIG. 3b illustrates MEMS acoustic transducer 100d including membrane 102, center post 104, and active area 106 as similarly described hereinabove in reference to FIGS. 1a and 3a. For MEMS acoustic transducer 100d, post radius r of center post 104 may be larger than post radius r of center post 104 for MEMS acoustic transducer 100c. For example, post radius r may be larger than 100 µm. When post radius r is larger, the mechanical stability of membrane 102 is increased and active area 106 is decreased.

According to various embodiments, post radius r may range from 10 µm to about 25% of the diameter of membrane 102, i.e., the diameter, 2·r, of center post 104 may range as high as 50% of the diameter of membrane 102. In alternative embodiments, post radius r may be outside this range.

FIG. 3c illustrates MEMS acoustic transducer 100e including membrane 102, center post 105, active area 106, and active area 107 as similarly described hereinabove in reference to FIG. 1a with the addition of active area 107 inside center post 105. According to some embodiments, center post 105 is a pipe or ring-shaped support, but is otherwise similar to center post 104 as described hereinabove in reference to FIGS. 1a, 1b, 3a, and 3b.

In such embodiments, active area 106 is formed outside center post 105, between center post 105 and the perimeter of membrane 102, and active area 107 is formed inside center post 105. For example, the region within and fixed by center post 105 forms a small disk-shaped transducer membrane and the region outside and fixed by center post 105 forms an annulus-shaped transducer membrane. In such embodiments, membrane 102 may be a same membrane formed of a common membrane layer and center post 105 fixes membrane 102 in a ring to form the smaller disk membrane with active area 107 and the larger annulus membrane with active area 106.

Figure 4C:
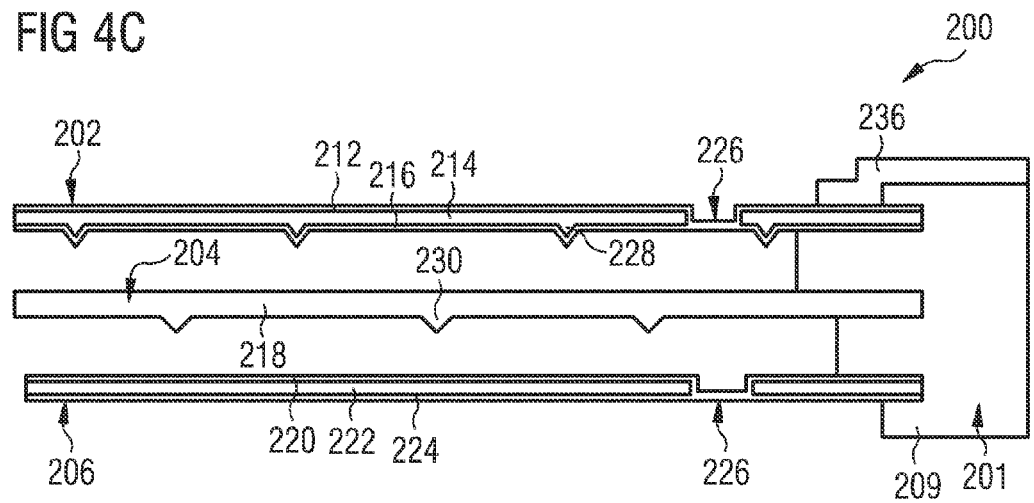

FIGS. 4a, 4b, and 4c illustrate schematic diagrams of portions of an embodiment transducer structure 200 including support structure 201, top backplate 202, membrane 204, bottom backplate 206, and center post 208 with ventilation hole 210. Transducer structure 200 may be part of a MEMS acoustic transducer. FIGS. 4a and 4b illustrate a portion near the center, including center post 208, and FIG. 4c illustrates a portion near the perimeter, including support structure 201.

FIG. 4a illustrates a cross-sectional side view of transducer structure 200 near a center portion and FIG. 4b illustrates a cross-sectional perspective view of transducer structure 200 near the center portion. According to various embodiments, top backplate 202, center post 208, and membrane 204 include ventilation hole 210 for equalizing pressure. For example, as pressure changes in the environment occur, the pressure on one side of membrane 204 exceeds the pressure on the other side of membrane 204 and ventilation hole 210 balances the pressure on both sides of membrane 204. For a microphone, displacements caused by atmospheric pressure changes may adversely affect sound sensing by causing, for example, clipping. Thus, ventilation hole 210 may improve operation of a MEMS microphone or a MEMS microspeaker. In another example, ventilation hole 210 may prevent damage to membrane 204 from very large sound pressure level signals.

According to various embodiments, top backplate 202 includes insulating layer 212, conductive layer 214, and insulating layer 216. Membrane 204 includes conductive layer 218 and center post 208 includes insulating layer 209. Bottom backplate 206 includes insulating layer 220, conductive layer 222, and insulating layer 224. Segmentation 226 segments portions of top backplate 202 and bottom backplate 206. Anti-stiction bumps 228 on top backplate 202 prevent stiction with membrane 204. Further, anti-stiction bumps 230 on membrane 204 prevent stiction with bottom backplate 206. In various embodiments, top backplate 202 includes perforations 203 and bottom backplate 206 includes perforations 207.

In various embodiments, insulating layers 212, 216, 209, 220, and 224 are formed of oxide or nitride. In some embodiments, insulating layers 212, 216, 209, 220, and 224 are formed of silicon oxide or silicon nitride. In a particular embodiment, insulating layers 212, 216, 220, and 224 are formed of silicon nitride and insulating layer 209 is formed of silicon oxide. In other embodiments, insulating layers 212, 216, 209, 220, and 224 may be formed of other insulating materials such as, for example, other dielectric materials or polymers.

In various embodiments, conductive layers 214, 218, and 222 are formed of a metal or semiconductor. In specific embodiments conductive layers 214, 218, and 222 are formed of polysilicon. In further embodiments, conductive layers 214, 218, and 222 are formed of another semiconductor material, such as doped semiconductor. In alternative embodiments, conductive layers 214, 218, and 222 are formed of aluminum, gold, silver, or platinum.

In further embodiments, membrane 204 may also be formed of multiple layers with multiple materials. Further, as described hereinabove in reference to FIG. 2a, for example, bottom backplate 206 may be omitted in some embodiments. In such embodiments, top backplate 202 may overly membrane 204 (as shown) or membrane 204 may overly top backplate 202 (opposite as shown). In additional embodiments, as described hereinabove in reference to FIGS. 2b and 2d, center post 208 may be formed between membrane 204 and bottom backplate 206 instead of or in addition to being formed between membrane 204 and top backplate 202.

FIG. 4b further illustrates small release holes 232 in top backplate 202 and release holes 234 in bottom backplate 206. In various embodiments, small release holes 232 in top backplate 202 may control the extent to which center post 208 is etched during a fabrication sequence. In various embodiments, small release holes, such as small release holes 232 and small release holes 235, are used to form or define a smooth edge. Particularly, small release holes 232 in top backplate 202 are used to etch a smooth edge defining the position of center post 208 and to etch a smooth edge in support structure 201 defining the clamping perimeter of membrane 204 from above. Similarly, small release holes 235 are used to etch a smooth edge in support structure 201 defining the clamping perimeter of membrane 204 from below. Further, release holes 234 in bottom backplate 206 may cause any center post from between membrane 204 and bottom backplate 206 to be removed during a release etch. In various embodiments, release holes 234 and small release holes 232 may be arranged in order to position center post 208 or ventilation hole 210 according to any of the various embodiments described herein. In other embodiments, center post 208 may be located in or attached to various areas of membrane 204 other than the center and may have a circular or a non-circular shape.

FIG. 4c illustrates a cross-sectional side view of transducer structure 200 near the perimeters of top backplate 202, membrane 204, and bottom backplate 206. According to various embodiments, support structure 201 clamps or fixes top backplate 202, membrane 204, and bottom backplate 206 at the respective perimeters. Support structure 201 is formed of insulating layer 209. In various embodiments, support structure may be formed of multiple layers during a fabrication sequence. In one example embodiment, insulating layer 209 is silicon oxide formed using tetraethyl orthosilicate (TEOS) in multiple applications to form support layers in between bottom backplate 206, membrane 204, and top backplate 202. Further, passivation layer 236 may be formed on support structure 201. Passivation layer 236 may be formed of any of the materials described hereinabove in reference to insulating layers 212, 216, 209, 220, and 224.

In various embodiments (not shown), metallization may be formed in vias in support structure 201 to form electrical connections to top back plate 202, membrane 204, and bottom backplate 206. In particular embodiments, the top and bottom clamping perimeters for membrane 204 provided by support structure 201 and defined by the positioning of small release holes 232 and small release holes 235, respectively, are misaligned as described in co-pending U.S. patent application Ser. No. 14/298,529, filed Jun. 6, 2014, and entitled "System and Method for a Microphone," which is incorporated herein by reference in its entirety.

FIGS. 5a, 5b, 5c, 5d, and 5e illustrate cross-sectional views of portions of further embodiment transducer structures 240a, 240b, 240c, 240d, and 240e. Transducer structures 240a, 240b, 240c, 240d, and 240e may be part of a MEMS acoustic transducer, as described hereinabove in reference to transducer structure 200 in FIGS. 4a, 4b, and 4c, where center post 208 has been replaced with alternative embodiment center bumps 238a, 238b, 238c, and 238d in FIGS. 5a, 5b, 5c, 5d, and 5e.

Figure 5A:
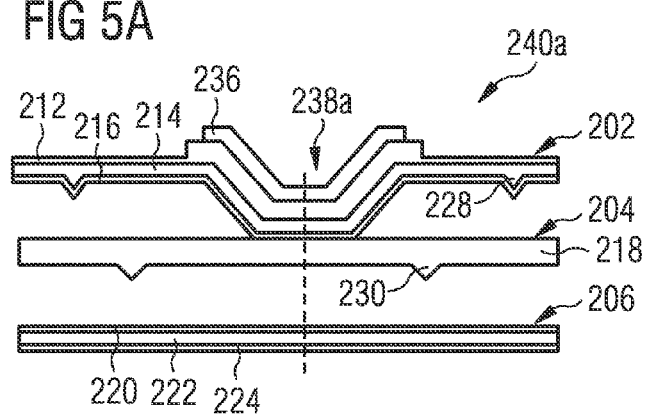

FIG. 5a illustrates transducer structure 240a according to an embodiment including center bump 238a, which is a depression in top backplate 202. Center bump 238a includes all the layers of top backplate 202, including insulating layer 212, conductive layer 214, and insulating layer 216. Center bump 238a also includes passivation layer 236. In such embodiments, center bump 238a may form a larger parasitic capacitance between top backplate 202 and membrane 204 in the depression forming center bump 238a.

Figure 5B:
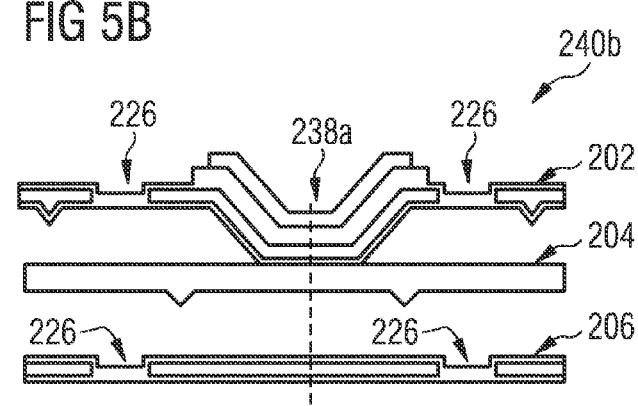

FIG. 5b illustrates transducer structure 240b according to another embodiment including center bump 238a. Transducer structure 240b is similar to transducer structure 240a with the addition of segmentation 226. Segmentation 226 removes the high parasitic capacitance introduced by center bump 238a by electrically decoupling center bump 238a from top backplate 202 and electrically decoupling a region in bottom backplate 206 below center bump 238a from bottom backplate 206.

FIG. 5c illustrates transducer structure 240c according to another embodiment including center bump 238b, which is a depression in top backplate 202. Transducer structure 240c and center bump 238b are similar to transducer structure 240b and center bump 238a, with the exception that passivation layer 236 is removed from center bump 238b.

FIG. 5d illustrates transducer structure 240d according to another embodiment including center bump 238c, which is a depression in top backplate 202. Transducer structure 240d and center bump 238c are similar to transducer structure 240c and center bump 238b, with the exception that conductive layer 214 in top backplate 202 is also removed from center bump 238c.

FIG. 5e illustrates transducer structure 240e according to another embodiment including center bump 238d, which is a depression in top backplate 202. Transducer structure 240e and center bump 238d are similar to transducer structure 240b and center bump 238a, with the exception that conductive layer 214 in top backplate 202 is removed from center bump 238d.

In alternative embodiments, center bumps 238a, 238b, 238c, and 238d may be included in place of center post 208 in transducer structure 200 as described hereinabove in reference to FIGS. 4a, 4b, and 4c. Further, center bumps 238a, 238b, 238c, and 238d may be inverted and formed between bottom backplate 206 and membrane 204 in further alternative embodiments.

Figure 6A:
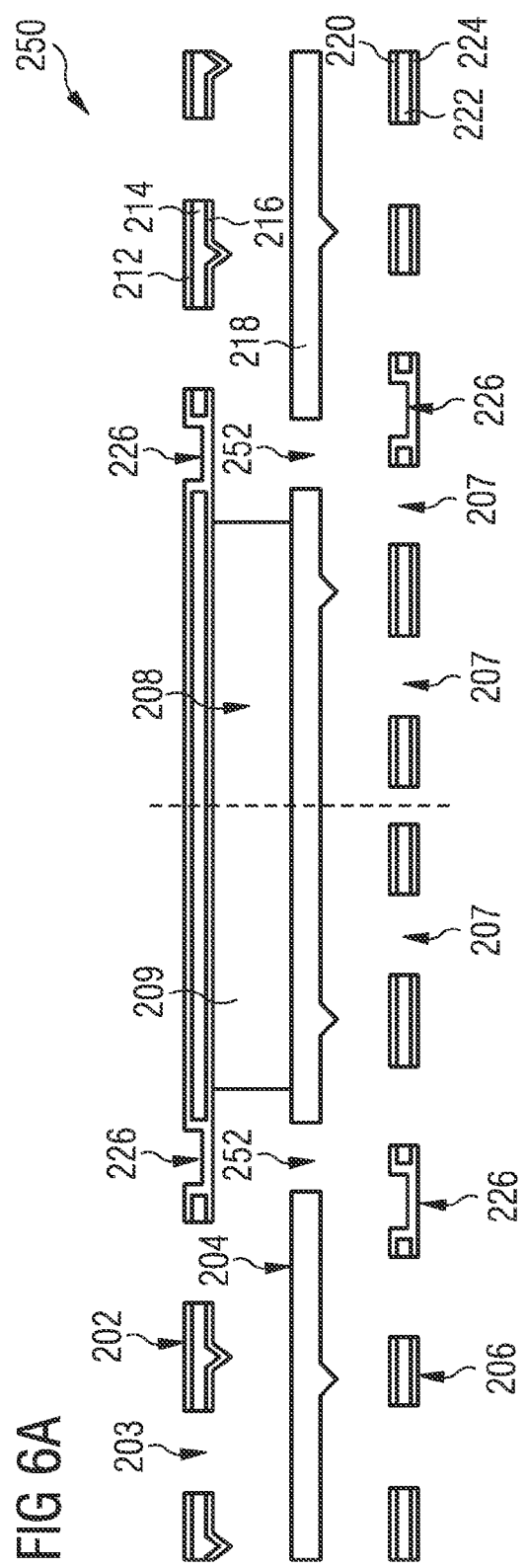

FIGS. 6a and 6b illustrate schematic diagrams of portions of another embodiment transducer structure 250. FIG. 6a illustrates a cross-sectional side view of transducer structure 250 near a center portion and FIG. 6b illustrates a top view of transducer structure 250 near the center portion. Transducer structure 250 may be part of a MEMS acoustic transducer as described hereinabove in reference to transducer structure 200 in FIGS. 4a, 4b, and 4c, where ventilation hole 210 is replaced with ventilation holes 252.

According to various embodiments, ventilation holes 252 are formed in membrane 204 around center post 208. In such embodiments, center post 208 does not include a hole formed there through as described in reference to ventilation hole 210 in FIGS. 4a, 4b, and 4c. Ventilation holes 252 may be formed around center post 208 as shown from the top view in FIG. 6b. In other embodiments, ventilation hole 210 as described hereinabove in reference to FIGS. 4a-4c may be included in addition to ventilation holes 252. In further embodiments, ventilation holes 252 may be include in other areas of the active membrane area in addition to or instead of immediately around center post 208.

FIG. 7 illustrates a schematic diagram of portions of still another embodiment transducer structure 260. According to an embodiment, transducer structure 260 may be part of a MEMS acoustic transducer as described hereinabove in reference to transducer structure 200 in FIGS. 4a, 4b, and 4c, where the central portion of bottom backplate 206, including release holes 234, is replaced with opening 262. The segmented central portion of bottom backplate 206 below center post 208 in transducer structure 200 is removed in transducer structure 260 in order to form opening 262 below center post 208.

FIG. 8 illustrates a schematic diagram top view with a cross-sectional view of a portion of a yet further embodiment transducer structure 270. According to an embodiment, transducer structure 270 may be part of a MEMS acoustic transducer as described hereinabove in reference to transducer structure 200 in FIGS. 4a, 4b, and 4c, where center post 272 is included between membrane 204 and bottom backplate 206. In such embodiments, small release holes 232 and small release holes 235 surround center post 208 and center post 272 and control the release etch for forming center post 208 and center post 272.

The top view shows the positioning of small release holes 232 in top backplate 202 along with perforations 203. In some embodiments, bottom backplate 206 also includes an identical structure with small release holes 235 and perforations 207. As shown by the mapping of the cross-section A-B, the effective etch rate during a release etch may form center post 208 and center post 272 of different diameters. Transducer structure 270 is illustrated without a ventilation hole, such as ventilation hole 210. In further embodiments, transducer structure 270 may include a ventilation hole through top backplate 202, center post 208, membrane 204, center post 272, and bottom backplate 206, similar to ventilation hole 210 described hereinabove in reference to FIGS. 4a, 4b, and 4c. In other embodiments, center post 208 and center post 272 may be located in or attached to various areas of membrane 204 other than the center and may have a circular or a non-circular shape.

FIG. 9 illustrates a schematic diagram top view with cross-sectional views of a still further embodiment transducer structure 300 including membrane 302, backplate 304, center ring 306, support structure 308, substrate 310, and electrical contacts 312. According to various embodiments, transducer structure 300 may operate similar to transducer structures described hereinabove in reference to the other figures, but includes only a single backplate. In various embodiments, center ring 306 connects backplate 304 to membrane 302 in a center region. Center ring 306 is hollow in the center and membrane 302 is also open inside center ring 306. In such embodiments, removing membrane 302 inside center ring 306 may reduce parasitic capacitance.

According to various embodiments, substrate 310 supports backplate 304 and membrane 302 with support structure 308 providing spacing between membrane 302 from backplate 304. The materials and structure of each element in transducer structure 300 may be implemented as described herein in reference to corresponding elements in the other figures. According to some embodiments, backplate 304 may include structural fins 314, which provide additional mechanical robustness for transducer structure 300. Substrate 310 may include cavity 311 formed below backplate 304. Cavity 311 is formed to pass completely through substrate 310, such as by being formed with a backside etch process, in some embodiments.

Figure 10A:
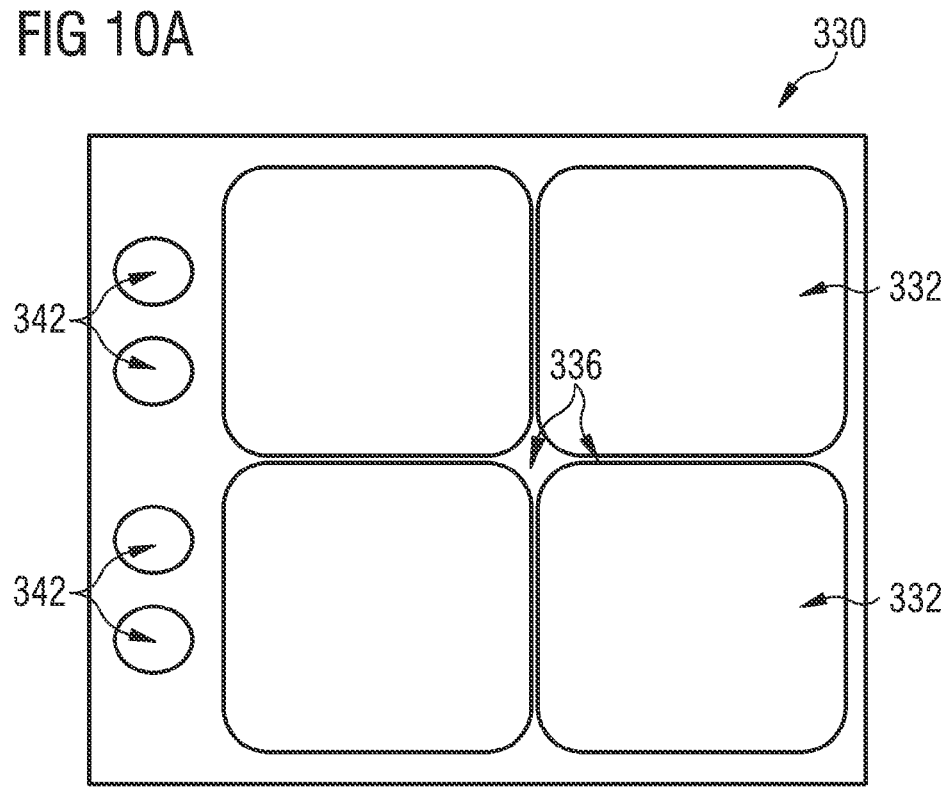
FIGS. 10a and 10b illustrate schematic diagrams of yet another embodiment transducer structure.
Figure 10B:
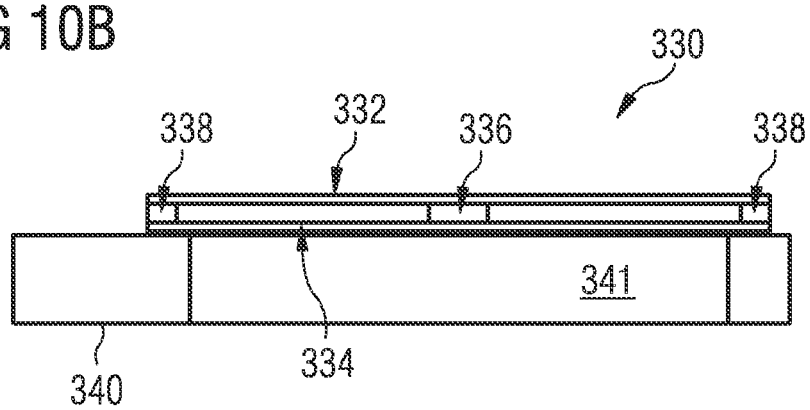

FIGS. 10a and 10b illustrate schematic diagrams of yet another embodiment transducer structure 330 including membrane 332, backplate 334, mechanical structure 336, support structure 338, substrate 340, and electrical contacts 342. According to various embodiments, transducer structure 330 may operate similar to transducer structures described hereinabove in reference to the other figures, but includes mechanical structure 336 attaching portions of membrane 332 to portions of backplate 334 in order to produce a partitioned four quadrant membrane. In such embodiments, mechanical structure 336 partitions each quadrant of membrane 332 into a separate membrane that is fixed on each of four edges by mechanical structure 336 or support structure 338 around the perimeter of membrane 332.

In various embodiments, the materials and structure of each element in transducer structure 330 may be implemented as described herein in reference to corresponding elements in the other figures. The positioning of mechanical structure 336 supports membrane 332 and partitions the maximum deflection into four quadrants. For example, as described hereinabove in reference to FIGS. 1a and 1b, the maximum deflection of membrane 332 according to the first harmonic would occur at the center of membrane 332 if mechanical structure 336 were omitted and membrane 332 were free to move. The positioning of mechanical structure 336 fixes, or attaches, the center of membrane 332 to the backplate and shifts the point of maximum deflection into each quadrant forming a quad-membrane.

In other embodiments, mechanical structure 336 may have other shapes and be located in and attached to other portions of membrane 332. In various embodiments, cavity 341 is formed in substrate 340 and passes through substrate 340. For example, cavity 341 may be formed by a backside etch.

FIG. 11 illustrates a block diagram of a method of forming an embodiment MEMS acoustic transducer using fabrication sequence 400 that includes steps 402-422. According to various embodiments, fabrication sequence 400 may be used to form MEMS acoustic transducers with either center posts, as described hereinabove in reference to FIGS. 4a-4c, 6a, and 6b, for example, center bumps, as described hereinabove in reference to FIGS. 5a-5e, for example, or another mechanical connecting structure. In various embodiments, steps 408 and 412 in particular describe forming and patterning the center posts. However, in specific embodiments, the material of the center post may be deposited in steps 408 or 412, release holes may be formed in the first or second backplates in steps 406 or 414, and the center posts may be patterned during the release etch of step 422 based on the release holes of steps 406 or 414.

In various embodiments, fabrication sequence 400 begins with a substrate in step 402. The substrate may be formed of a semiconductor, such as silicon, or as another material, such as a polymer for example. In step 404, a structural layer may be formed on the substrate. In various embodiments, the structural layer may be used to produce a non-planar structure for producing a corrugated membrane or for spacing the membrane or backplate from the substrate. For example, in embodiments with a single backplate where the first backplate and steps 406 and 408 are omitted, the structural layer may be a non-planar structure to produce corrugation in the membrane. In some such embodiments, the structural layer may be a deposited oxide that is lithographically patterned to produce corrugation when the membrane layer is formed in step 410. In other such embodiments, the structural layer may include multiple layers and other techniques. For example, a local oxidation of silicon (LOCOS) process may be used to either produce a non-planar oxide layer with smooth edges or a non-planar silicon surface with smooth edges (when the non-planar oxide is removed). The LOCOS process includes deposition of silicon nitride and patterning of the silicon nitride to expose the silicon beneath the silicon nitride in some regions. Once the silicon is exposed, the LOCOS process includes thermally growing an oxide layer that extends beneath the silicon nitride with a smooth transition edge. Once the silicon nitride is removed, the resulting non-planar surface has smooth edges. Similarly, the thermally grown oxide consumes a portion of the silicon substrate to produce a non-planar silicon surface beneath the oxide with smooth edges between regions. In various such embodiments, the LOCOS process may be used on a surface of the substrate to prepare a non-planar surface that will produce a corrugated membrane once the membrane is disposed and patterned on the non-planar surface. The structural layer may be an oxide or other structural insulating material in various embodiments.

In some embodiments, the structural layer formed in step 404 is used to space the next layer, first backplate (step 406) or membrane (step 410), from the substrate. Thus, the structural layer may be used as a spacing layer for the bottom backplate or membrane. In alternative embodiments, step 404 may be omitted and step 405 may include forming an etch stop layer directly on the substrate and the first backplate directly on the etch stop layer. In various embodiments, step 404 may also include forming and patterning a bump in the structural layer in preparation for forming a center bump in the first backplate. The structural layer bump formed in step 404 may provide a pattern to form a center bump as similarly described hereinabove in reference to FIGS. 5a-5e, but inverted in comparison to center bumps 238a, 238b, 238c, and 238d.

An etch stop layer is formed on the structural layer in step 405. The etch stop layer may be silicon oxide or silicon nitride, for example. In other embodiments, the etch stop layer may be an alternative material, such as another oxide, nitride, or oxynitride, for example. In further embodiments, the etch stop layer may include multiple layers, such as an oxide and an oxynitride.

In step 406, the first backplate is formed by forming and patterning layers for the first backplate. In various embodiments, the first backplate may be formed and patterned according to any of the embodiments described hereinabove in reference to the other figures. The first backplate may be formed by depositing and patterning multiple layers. In an example embodiment, step 406 includes depositing or forming a first layer on the etch stop layer formed in step 405 or the structural layer formed in step 404. The first layer may be an insulating layer that is a patternable structural material. For example, the first layer may be an oxide, a nitride, an oxynitride, other dielectrics, or a polymer. In specific embodiments, the first layer is silicon oxide or silicon nitride. In various embodiments, the second layer may be deposited or formed using any of the methods known to those of skill in the art to be compatible with the material selected for deposition or formation, such as chemical vapor deposition (CVD), physical vapor deposition (PVD), or thermal oxidation for example.

Step 406 may also include patterning the first layer to form perforations, etch release holes, and ventilation holes in the first backplate. In such embodiments, patterning the first layer may include a lithographic process including applying a photoresist, patterning the photoresist using a mask for exposure and a developer solution, and etching the first layer according to the patterned photoresist. In various embodiments, such patterning may include photolithography, electron beam lithography, ion beam or lithography. In still further embodiments, patterning may include x-ray lithography, mechanical imprint patterning, or microscale (or nanoscale) printing techniques. Still further approaches for patterning the first layer may be used in some embodiments, as will be readily appreciated by those of skill in the art.

Step 406 may also include forming a second layer that is conductive. The second layer may be polysilicon in some embodiments. In other embodiments, the second layer is a metal such as silver, gold, aluminum, or platinum. In further embodiments, the second layer is any type of semiconductor, such as a doped semiconductor material. In alternative embodiments, the second layer may be another metal, such as copper. The second layer may be deposited or formed using any of the methods known to those of skill in the art to be compatible with the material selected for deposition or formation, such as electroplating, CVD, or PVD, for example.

Step 406 may also include patterning the second layer. Patterning the second layer may be performed using any of the techniques described in reference to the first layer in step 406. The second layer may be patterned to form the conductive layer of the first backplate. For example, the second layer may be patterned to form a circular sensing plate with perforations, etch release holes, and ventilation holes. Further, the second layer may be patterned to include segmentation, such as segmentation 226 as described hereinabove in reference to FIG. 4a, for example. Similarly, in other embodiments involving other structures for other types of transducers, the second layer may be patterned according to the specific type of transducer.

Step 406 also includes depositing or forming a third layer on top of the second layer. The third layer is an insulating layer that may be formed using any of the techniques or materials described in reference to the first layer. Further, the third layer may be patterned as described hereinabove in reference to the first layer of step 406. Thus, step 406 includes forming and patterning a three layer stack of an insulating material, a conductive material, and an insulating material. In other embodiments, step 406 may include forming and patterning any number of layers, depending on the specific structure formed.

According to various embodiments, step 406 may include forming a center bump, such as an inverted version of center bumps 238a, 238b, 238c, and 238d described hereinabove in reference to FIGS. 5a-5e. The first backplate may be formed with the center bump over the structural layer bump optionally formed in step 404. In various embodiments, the center bump formed in the first backplate may include any of the additional patterning or layer variations, for example, as described hereinabove in reference to FIGS. 5a-5e.

In further embodiments, step 406 may also include additional steps of depositing or forming sacrificial layers and performing planarization steps on the sacrificial layers and the first, second, or third layers. For example, a chemical mechanical polish (CMP) may be applied to the sacrificial layer and the first, second, or third layer in various embodiments. As another embodiment, the first, second, and third layers may be patterned together. For example, the first layer, the second layer, and the third layer may be deposited or formed one after another and a single mask may be used to pattern the first backplate including all three layers. In such embodiments, an etch step may be performed that includes a single selective etch of the first layer, the second layer, and the third layer. Alternatively, an etch sequence may be used with multiple selective etchants.

Following step 406, step 408 includes forming and patterning a structural layer, such as TEOS oxide. Forming and patterning in step 408 is performed in order to provide spacing for a membrane. The structural layer may be patterned in order to form anti-stiction bumps for the membrane. The structural layer may also be patterned in order to form corrugation for the membrane as described hereinabove in reference to step 404. In addition, the structural layer formed in step 408 may include multiple depositions or a planarization step, such as a CMP.

According to various embodiments, step 408 may also include forming a center post between the first backplate and the membrane. The center post may be formed and patterned at the same time as the structural layer separating the membrane from the first backplate. For example, center post 208, as described hereinabove in reference to FIGS. 4a, 4b, and 4c, may be formed in step 408. In some embodiments, the center post between the bottom backplate and the membrane may be omitted.

Step 410 includes forming the membrane layer and patterning the membrane. The membrane layer may be formed of polysilicon, for example. In other embodiments, the membrane layer may be formed of other conductive materials, such as a doped semiconductor or a metal, for example. In various embodiments, the membrane may be formed and patterned according to any of the embodiments described hereinabove in reference to FIGS. 4a-4c, 5a-5e, 6a, and 6b, for example. Patterning the membrane layer in step 410 may include a photolithographic process, for example, that defines the membrane shape or structure. The membrane may include anti-stiction bumps based on the structure formed in step 408. In various embodiments, the membrane in step 410 may be formed and patterned as described hereinabove in reference to the second layer in step 406. The membrane may be patterned with one or more ventilation holes.

In various embodiments, step 412 includes forming and patterning additional structural material, such as TEOS oxide. Similar to step 408, the structural material may be formed and patterned in step 412 to space a second backplate from the membrane and provide anti-stiction bumps in the second backplate.

As described hereinabove in reference to step 408, step 412 may also include forming a center post between the first backplate and the membrane. The center post may be formed and patterned at the same time as the structural layer separating the membrane from the second backplate. For example, center post 208, as described hereinabove in reference to FIGS. 4a, 4b, and 4c, may be formed in step 412. In some embodiments, the center post between the top backplate and the membrane may be omitted. In alternative embodiments, a depression or hole may be formed in the additional structural layer in preparation for a center bump as described hereinabove in reference to steps 404 and 406, as well as in reference to FIGS. 5a-5e.

Step 414 includes forming and patterning the layers of the second backplate. In some embodiments, forming and patterning in step 414 includes deposition of layers and photolithographic patterning, for example. The second backplate in step 414 may be formed and patterned as described hereinabove in reference to forming and patterning the first backplate in step 406. Thus, the second backplate may include a three layer stack of an insulating layer, a conductive layer, and an insulating layer. In various embodiments, the second backplate along with the structural layer formed in step 412 may be omitted. In other embodiments where the second backplate is not omitted, the second backplate may be formed and patterned according to any of the embodiments described hereinabove in reference to the other figures. In some embodiments, the first backplate may be omitted and the second backplate included. In such embodiments, step 406 and step 408 may be omitted in order to form the membrane of step 410 on the etch stop layer of step 405 or the structural layer of step 404. As similarly described hereinabove in reference to step 406, step 414 may include forming the center bump in the depression or hole of step 412, where the center bump is as described hereinabove in reference to steps 404 and 406, as well as in reference to FIGS. 5a-5e.

Following step 414, step 416 includes forming and patterning additional structural material in various embodiments. The structural material may be TEOS oxide. In some embodiments, the structural material is deposited as a sacrificial material or a masking material for subsequent etch steps or patterning steps. Step 418 includes forming and patterning contact pads. Forming and patterning the contact pads in step 418 may include etching contact holes in the existing layers to provide openings to the second backplate, membrane, first backplate, and substrate. After forming the openings to each respective structure or layer, the contact pads may be formed by depositing a conductive material, such as a metal, in the openings and patterning the conductive material to form separate contact pads. The metal may be aluminum, silver, or gold in various embodiments. Alternatively, the metallization may include a conductive paste, for example, or other metals, such as copper.

In various embodiments, step 420 includes performing a backside etch process in the substrate of step 402, such as a Bosch etch process. The backside etch process forms a cavity in the substrate that may be coupled to a sound port for the fabricated microphone or may form a reference cavity. Step 422 includes performing a release etch to remove the structural materials protecting and securing the first backplate, membrane, and second backplate. Following the release etch in step 422, the first backplate, membrane, and second backplate may be released in a sensing portion overlying the cavity. The membrane may be free to move and the first and second backplates may be rigid in some embodiments. As described hereinabove in reference to fabrication sequence 400, the release etch in step 422 may form various embodiment center posts, as described in steps 408 and 412, based on the positioning of release etch holes in the first or second backplates. In various embodiments, the structural layers of steps 404, 408, and 412 may be etched around the perimeter of the backplates or membrane to form tapered clamping edges as described in U.S. Pat. No. 8,461,655, filed Mar. 31, 2011, and entitled "Micromechanical sound transducer having a membrane support with tapered surface," which is incorporated herein by reference in its entirety.

As described hereinabove, fabrication sequence 400 may be modified in specific embodiments to include only a single backplate and membrane. Those of skill in the art will readily appreciate that numerous modifications may be made to the general fabrication sequence described hereinabove in order to provide various benefits and modifications known to those of skill in the art while still including various embodiments of the present invention. In some embodiments, fabrication sequence 400 may be implemented to form a MEMS microspeaker or a MEMS microphone, for example. Fabrication sequence 400 may be implemented to form a pressure sensor in other embodiments.

According to an embodiment, a microelectromechanical systems (MEMS) transducer includes a first electrode, a second electrode fixed to an anchor at a perimeter of the second electrode, and a mechanical support separate from the anchor at the perimeter of the second electrode and connected to the first electrode and the second electrode. The mechanical support is fixed to a portion of the second electrode such that, during operation, a maximum deflection of the second electrode occurs between the mechanical structure and the perimeter of the second electrode. Other embodiments include corresponding systems and apparatus, each configured to perform corresponding embodiment methods.

In various embodiments, the first electrode is a perforated backplate and the second electrode is a deflectable membrane. The deflectable membrane may have a diameter and a thickness, where the diameter is at least 1000 times larger than the thickness. In some embodiments, the MEMS transducer further includes a third electrode. The MEMS transducer may further include an additional mechanical support connected to the third electrode and the second electrode. In some embodiments, the first electrode is a perforated first backplate, the second electrode is a deflectable membrane, and the third electrode is a perforated second backplate.

In various embodiments, the mechanical support includes a post fixed to a central portion of the second electrode. The mechanical support may include a partitioning structure connected between the first electrode and the second electrode, where the partitioning structure partitions the second electrode into a plurality of deflectable regions, each region having a maximum deflection point. In some embodiments, the partitioning structure is configured to partition the second electrode into four deflectable regions, and the second electrode includes a quad-membrane partitioned into four deflectable quadrants by the partitioning structure.

According to an embodiment, MEMS transducer includes a backplate having a clamped portion and a released portion, a membrane spaced from the backplate and having a clamped portion and a released portion, and a post connected to a central region of the released portion of the backplate and a central region of the released portion of the membrane. Other embodiments include corresponding systems and apparatus, each configured to perform corresponding embodiment methods.

In various embodiments, the post includes a single insulating material formed between the backplate and the membrane. The MEMS transducer may further include a ventilation hole formed in a center of the post and in a center of the membrane. In some embodiments, the MEMS transducer further includes a plurality of ventilation holes formed in the membrane around the post. The MEMS transducer may further include a ventilation hole formed in the membrane.

In various embodiments, the backplate includes a rigid and perforated structure overlying the membrane. The MEMS transducer may further include an additional backplate having a clamped portion and a released portion. In such embodiments, the additional backplate is arranged on an opposite side of the membrane as the backplate. In some embodiments, the MEMS transducer further includes a structural support connected to the clamped portion of the backplate and the clamped portion of the membrane. The post may be formed of a same material as the structural support. In some embodiments, the structural support and the post are formed of silicon oxide.

According to an embodiment, a method of forming a MEMS transducer includes forming a first perforated backplate, forming a structural layer, forming a first mechanical support in a portion of the first perforated backplate, and forming a deflectable membrane. The deflectable membrane is fixed to the structural layer at a perimeter of the deflectable membrane and is spaced apart from the first perforated backplate by the structural layer and the first mechanical support. The first mechanical support is connected to the portion of the first perforated backplate and a portion of the deflectable membrane and is connected to the portion of the first perforated backplate within the perimeter of the deflectable membrane. Other embodiments include corresponding systems and apparatus, each configured to perform corresponding embodiment methods.

In various embodiments, the method further includes forming a second perforated backplate. The method may further include forming a second mechanical support in a portion of the second perforated backplate. The second mechanical support is connected to the portion of the second perforated backplate and the portion of the deflectable membrane. In some embodiments, the first perforated backplate is formed below the deflectable membrane and overlying a cavity in a substrate. The first perforated backplate may be formed above the deflectable membrane and overlying a cavity in a substrate.

In various embodiments, the method further includes forming segmentation in the first perforated backplate. The method may further include forming a ventilation hole in the deflectable membrane. The ventilation hole may be formed in the membrane and in the first mechanical support. In some embodiments, the ventilation hole is formed in the membrane around the first mechanical support. Forming the structural layer and forming the first mechanical support may include disposing a single structural material and patterning the single structural material to form the first mechanical support and the structural layer. The single structural material includes silicon oxide in some embodiments.

In various embodiments, forming the first mechanical support includes forming a post fixed to a central portion of the first perforated backplate and fixed to a central portion of the deflectable membrane. Forming the first mechanical support may include forming a partitioning structure connected between the first perforated backplate and the deflectable membrane. In such embodiments, forming the partitioning structure includes partitioning the deflectable membrane into a plurality of deflectable regions, each region having a maximum deflection point. In some embodiments, partitioning the deflectable membrane includes forming a quad-membrane by partitioning the deflectable membrane into four deflectable quadrants using the partitioning structure.

According to an embodiment, a MEMS acoustic transducer includes a variable capacitance sensor including a deflectable membrane and a mechanical support coupled to the deflectable membrane. In such embodiments, the first harmonic of the deflectable membrane produces a maximum deflection of the deflectable membrane in a region between a perimeter of the deflectable membrane and a center of the deflectable membrane. Other embodiments include corresponding systems and apparatus, each configured to perform corresponding embodiment methods.

In various embodiments, the variable capacitance sensor further includes a rigid perforated backplate. The deflectable membrane and the rigid perforated backplate are spaced apart and released overlying a cavity in a substrate. In some embodiments, the variable capacitance sensor further includes an additional rigid perforated backplate that is arranged on an opposite side of the deflectable membrane as the rigid perforated backplate.

Advantages of various embodiments described herein may include MEMS transducers with a center post attached to a membrane fixed around the perimeter that allows for increased active area, and consequently increased sensitivity, and increased structural robustness of the transducer. In such embodiments, the membrane may deflect or oscillate according to the second harmonic of the membrane while the center post removes the first harmonic of the membrane. Thus, maximum deflection occurs between the center post and the perimeter of the membrane and not at the center of the membrane, which is fixed to the center post.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectromechanical systems (MEMS) transducer comprising:
   a first electrode;
   a second electrode fixed to an anchor around a perimeter of the second electrode; and
   a mechanical support separate from, and surrounded by, the anchor at the perimeter of the second electrode and mechanically connected to the first electrode and the second electrode, wherein the mechanical support is fixed to a portion of the second electrode such that, during operation, a maximum deflection of the second electrode occurs between the mechanical support and the perimeter of the second electrode.

2. The MEMS transducer of claim 1, wherein the first electrode is a perforated backplate and the second electrode is a deflectable membrane.

3. The MEMS transducer of claim 2, wherein the deflectable membrane has a diameter and a thickness, and wherein the diameter is at least 1000 times larger than the thickness.

4. The MEMS transducer of claim 1, further comprising a third electrode.

5. The MEMS transducer of claim 4, further comprising an additional mechanical support connected to the third electrode and the second electrode.

6. The MEMS transducer of claim 4, wherein the first electrode is a perforated first backplate, the second electrode is a deflectable membrane, and the third electrode is a perforated second backplate.

7. The MEMS transducer of claim 1, wherein the mechanical support comprises a post fixed to a central portion of the second electrode.

8. The MEMS transducer of claim 1, wherein the mechanical support comprises a partitioning structure connected between the first electrode and the second electrode, wherein the partitioning structure is configured to partition the second electrode into a plurality of deflectable regions, each region having a maximum deflection point.

9. The MEMS transducer of claim 8, wherein
   the partitioning structure is configured to partition the second electrode into four deflectable regions; and
   the second electrode comprises a quad-membrane partitioned into four deflectable quadrants by the partitioning structure.

10. A microelectromechanical systems (MEMS) transducer comprising:
    a backplate having a clamped portion and a released portion;
    a membrane spaced from the backplate, the membrane having a clamped portion and a released portion; and
    a post connected to a central region of the released portion of the backplate and a central region of the released portion of the membrane.

11. The MEMS transducer of claim 10, wherein the post comprises a single insulating material formed between the backplate and the membrane.

12. The MEMS transducer of claim 11, further comprising a ventilation hole formed in a center of the post and in a center of the membrane.

13. The MEMS transducer of claim 10, further comprising a plurality of ventilation holes formed in the membrane around the post.

14. The MEMS transducer of claim 10, further comprising a ventilation hole formed in the membrane.

15. The MEMS transducer of claim 10, wherein the backplate comprises a rigid and perforated structure overlying the membrane.

16. The MEMS transducer of claim 10, further comprising an additional backplate having a clamped portion and a released portion, wherein the additional backplate is arranged on an opposite side of the membrane as the backplate.

17. The MEMS transducer of claim 10, further comprising a structural support connected to the clamped portion of the backplate and the clamped portion of the membrane.

18. The MEMS transducer of claim 17, wherein the post is formed of a same material as the structural support.

19. The MEMS transducer of claim 18, wherein the structural support and the post are formed of silicon oxide.

20. A method of forming a microelectromechanical systems (MEMS) transducer, the method comprising:
forming a first perforated backplate;
forming a structural layer;
forming a first mechanical support in a portion of the first perforated backplate; and
forming a deflectable membrane, wherein
the deflectable membrane is fixed to the structural layer around a perimeter of the deflectable membrane,
the deflectable membrane is spaced apart from the first perforated backplate by the structural layer and the first mechanical support,
the first mechanical support is connected to the portion of the first perforated backplate and a portion of the deflectable membrane, and
the first mechanical support is connected to the portion of the first perforated backplate within the perimeter of the deflectable membrane, and is encircled by the structural layer.

21. The method of claim 20, further comprising forming a second perforated backplate.

22. The method of claim 21, further comprising forming a second mechanical support in a portion of the second perforated backplate, wherein the second mechanical support is connected to the portion of the second perforated backplate and the portion of the deflectable membrane.

23. The method of claim 20, wherein the first perforated backplate is formed below the deflectable membrane and overlying a cavity in a substrate.

24. The method of claim 20, wherein the first perforated backplate is formed above the deflectable membrane and overlying a cavity in a substrate.

25. The method of claim 20, further comprising forming segmentation in the first perforated backplate.

26. The method of claim 20, further comprising forming a ventilation hole in the deflectable membrane.

27. The method of claim 26, wherein the ventilation hole is formed in the membrane and in the first mechanical support.

28. The method of claim 26, wherein the ventilation hole is formed in the membrane around the first mechanical support.

29. The method of claim 20, wherein forming the structural layer and forming the first mechanical support comprises:
disposing a single structural material; and
patterning the single structural material to form the first mechanical support and the structural layer.

30. The method of claim 29, wherein the single structural material comprises silicon oxide.

31. The method of claim 20, wherein forming the first mechanical support comprises forming a post fixed to a central portion of the first perforated backplate and fixed to a central portion of the deflectable membrane.

32. The method of claim 20, wherein forming the first mechanical support comprises forming a partitioning structure connected between the first perforated backplate and the deflectable membrane, wherein forming the partitioning structure comprises partitioning the deflectable membrane into a plurality of deflectable regions, each region having a maximum deflection point.

33. The method of claim 32, wherein partitioning the deflectable membrane comprises forming a quad-membrane by partitioning the deflectable membrane into four deflectable quadrants using the partitioning structure.

34. A microelectromechanical systems (MEMS) acoustic transducer comprising:
a variable capacitance sensor comprising a deflectable membrane and a mechanical support coupled to the deflectable membrane; and
wherein a first harmonic of the deflectable membrane produces a maximum deflection of the deflectable membrane in a first region between a perimeter of the deflectable membrane and a center of the deflectable membrane, and wherein the first region deflects more than the center of the deflectable membrane.

35. The MEMS acoustic transducer of claim 34, wherein the variable capacitance sensor further comprises a rigid perforated backplate, wherein the deflectable membrane and the rigid perforated backplate are spaced apart and released overlying a cavity in a substrate.

36. The MEMS acoustic transducer of claim 35, wherein the variable capacitance sensor further comprises an additional rigid perforated backplate, wherein the additional rigid perforated backplate is arranged on an opposite side of the deflectable membrane as the rigid perforated backplate.

* * * * *